United States Patent [19]

Conway et al.

[11] Patent Number: 4,679,168

[45] Date of Patent: Jul. 7, 1987

[54] INTELLIGENT BROAD BAND DIGITAL RF MEMORY

[75] Inventors: Larry J. Conway; Paul I. Pulsifer, both of Kanata, Canada

[73] Assignee: Her Majesty the Queen in right of Canada, as represented by the Minister of National Defence, Ottawa, Canada

[21] Appl. No.: 698,438

[22] Filed: Feb. 5, 1985

[30] Foreign Application Priority Data

Jul. 30, 1984 [CA] Canada ................................. 459972

[51] Int. Cl.⁴ ............................................. G06F 12/00
[52] U.S. Cl. .................................. 364/900; 365/192; 365/194
[58] Field of Search ........................... 365/192, 194; 364/900 MS File

[56] References Cited

U.S. PATENT DOCUMENTS 3,613,013 10/1971 Vallese ............................ 365/192 X
4,318,183 3/1982 Byington et al. .................... 364/900

Primary Examiner—Raulfe B. Zache
Attorney, Agent, or Firm—Stevens, Davis, Miller & Mosher

[57] ABSTRACT

This invention describes a system for digitally storing high-frequency signals with the ability to retrieve and transmit these stored signals repetitively or with various selectable delays. The invention provides means to store the radio frequency signal by sampling the voltage of the wave distributed along delay line means at a number of points in parallel. These voltages are then quantized and stored in a digital memory. The wave is reconstructed at the output by the reverse process.

9 Claims, 4 Drawing Figures

INTELLIGENT BROAD BAND DIGITAL RF MEMORY

BACKGROUND OF THE INVENTION

1. Field of the Invention

This invention relates to a system for digitally storing high frequency signals and more particularly to a system for storing high frequency signals with the ability to retrieve and transmit stored signals repetitively or with various selectable delays. This type of system can be useful in the signal processing field as applied to radio, TV, satellite transmission, secure transmission, radar and communication jammers, etc.

2. Description of Related Art

One method of storing wideband high frequency signals is to down-convert the high frequency pulse signal to an intermediate frequency by local oscillation mixing for sampling and digitization. The digital words generated by analog-to-digital conversion are stored in a digital memory. The output signal is reconstructed by performing a digital-to-analog conversion on the stored contents of the digital memory, reconstituting the I.F. frequency. This frequency is then up-converted reproducing the original signal. This system has been previously described in ELECTRONIC WARFARE, "A Coherent Microwave Memory Using Digital Storage": "The Loopless Memory Loop", by S. C. Spector, January/February 1975, pages 108–110.

An extension of the above technique is to mix the incoming signal with a number of local oscillators having among them a common frequency but having different phases. The result of the mixing process is two sets of frequencies for each mixing signal, one set representing the sum frequencies and the other set representing the different frequencies. The sum phase frequencies are eliminated by filtering and the phase difference signals are quantized using digital techniques. The process of reconstructing the original signal involves mixing the stored digital signal after digital-to-analog conversion by signals having the frequency and phase of the original local oscillation mixing signals. The resulting product signals are summed and result in the reconstruction of the original signal. This system is further described in U.S. Pat. No. 3,947,827 which issued on Mar. 30, 1976 naming J. L. Dantremont, Jr., et al, as inventors.

An analog method of storing the signal is to introduce the high frequency signal into a memory loop. The received signal is amplified by an input travelling wave tube (TWT) and the loop TWT (for in-line memory operation) where it is divided into two paths. One path is the time-delayed section of the circulation loop and the other is coupled directly to the output TWT. After a time delay of T, the switch opens and the input path closes the loop just as the high frequency signal appears at the output to the delay line. The high frequency signal thus will continue to circulate, reproducing the input frequency.

Another method of analog storage is a parallel sampling approach described in applicant's Canadian Pat. No. 1,135,342 which issued on Nov. 9, 1982 naming T. W. Tucker, L. J. Conway, and S. L. Bouchard as inventors. This patent describes how the high frequency signal waveform is distributed along the delay line and is sampled at a number of points. The sampled voltages are then stored in analog memories. The signal is reconstructed by the reverse process of applying the stored voltage samples to an output delay line which is similar to the input line.

One problem with the first reference digital approach described above is the upper frequency limitation imposed by the speed of the current digitization circuitry which is limited to several hundred megahertz. Even the multi-phase approach has an instantaneous bandwidth limitation insofar as increased bandwidth can only be accommodated by additional mixer stages. The practical limitation in the number of stages would probably allow bandwidths to 1 GHz or so.

A second problem is the frequency and phase tracking requirements of the mixers. Any deviation of the frequency and/or phase between the input mixer and the output mixer will alter the quality of reconstruction of the stored signal.

Problems with the recirculating memory-loop as described are that phase coherence is retained only if the return delay is greater than the width of the input pulse signal. If the input pulse is longer than the return delay path the leading edge of the pulse will overlap the trailing edge of the pulse giving rise to constructive or destructive interference which destroys phase coherence. A second problem is that the complete pulse can only be recalled at increments in time which correspond to the recirculation time of the loop. Equally both analog approaches have limited storage times and therefore cannot be recalled at times greater than a few microseconds.

SUMMARY OF THE INVENTION

The present invention on the other hand provides means to store the radio frequency signal by sampling the voltage of the wave distributed along an input delay line at a number of points in parallel. These voltages are then quantized (analog-to-digital conversion) and stored in a digital memory. The wave is reconstructed at the output by the reverse process of digital-to-analog converting the stored values and applying the resulting values in parallel to an output delay line which is similar to the input delay line. This approach allows the storage of very wideband high frequency signals. It also permits acquisition, storage and reconstruction or modification of the input signal. The signal may be reconstructed or modified at any time and even be repeated continuously as desired. With current sampling technology bandwidths up to 16 GHz are believed possible.

This type of approach offers several advantages. It eliminates frequency shifting as observed in both the memory loop and mixer/digital storage systems and does not suffer from finite storage times as in the analog systems. As well, its rugged construction with semiconductor devices promotes the desirable characteristics of being a highly reliable and inexpensive device.

According to one aspect of this invention, there is provided an intelligent digital RF memory comprising: input/output delay line means for distributing an input signal; means for sampling the distributed signal at predetermined points along delay line means; means for converting said samples from analog levels to digital words; means for storing said digital words; control and processor means to access, modify and analyze said stored digital words; means for converting said digital words to analog levels; and means for applying said analog levels to said input/output delay line means at points corresponding to said predetermined points, whereby a reconstructed signal is formed.

BRIEF DESCRIPTION OF THE DRAWINGS

Particular embodiments of the invention will be described in conjunction with accompanying drawings in which.

DESCRIPTION OF THE PREFERRED EMBODIMENTS

Figure 1:
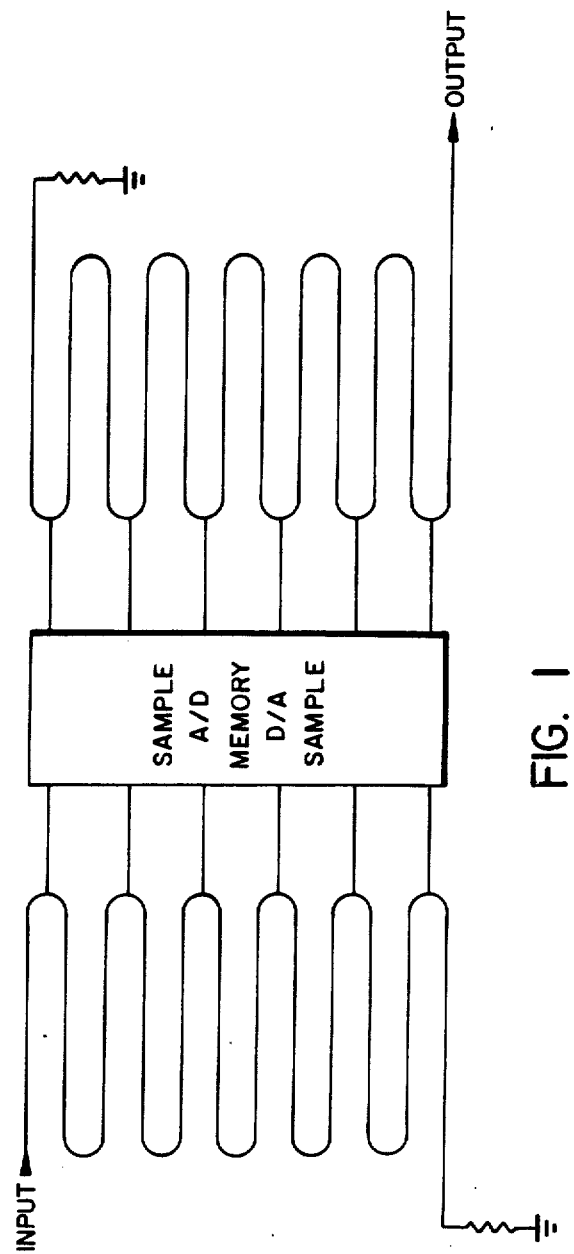
FIG. 1 is a block diagram of the fundamental design used in the present invention.
Figure 2:
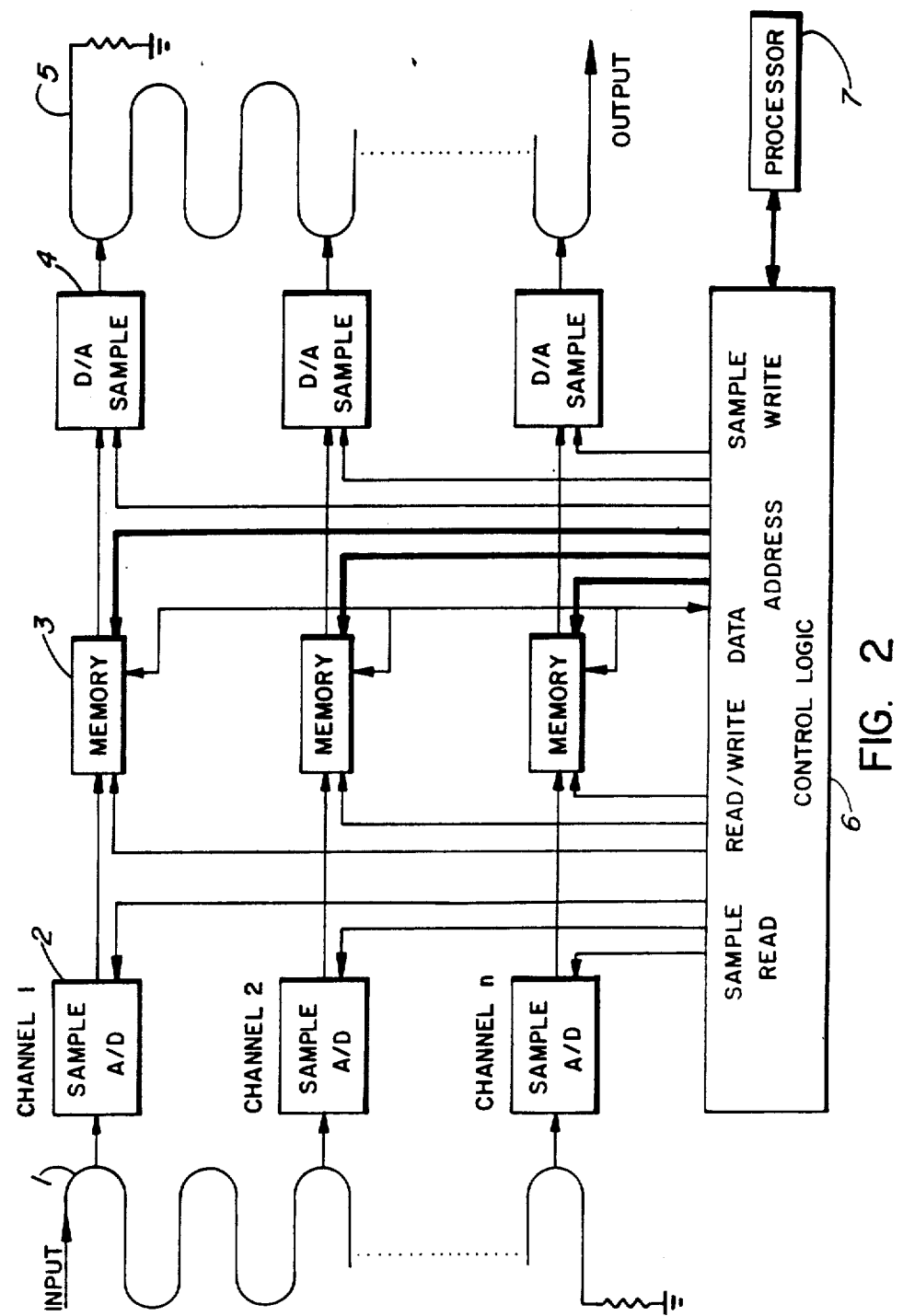
FIG. 2 shows a more detailed block diagram for the present invention.

Referring now to FIGS. 1 and 2, one embodiment of the invention is shown. It is comprised of an input delay line 1, sample A/D units 2, digital memories 3, D/A samplers 4, and output delay line 5, control logic 6 and processor 7. Upon receipt of an RF signal in the input delay line 1, the control logic 6 generates commands to the sample A/D units 2 to sample the input waveform and convert the sample to a digital word. Memory addresses are generated in memories 3 by control logic 6. At a time later corresponding to the conversion time of the A/D converters in sample A/D units 2 and memory set up time, the digital word is clocked into the memory device 3. The net result so far is that "n" samples of the input waveform are taken spatially along the input line. If the input signal is longer in time than the delay of the input line 1, the process is repeated with the digital words being stored in the next available memory location of memory 3.

To reconstruct the output waveform the process is reversed. That is the contents of the memory devices 3 are read out under control of the logic 6. The digital words are converted to analog levels and applied to the output delay line 5. To match the output waveform to the input waveform, the memory contents are read out in the same order and at the same rate as they were read in. Phase and frequency translations can therefore be implemented by varying one rate with respect to the other. In this illustration independent control of each channel (sampler, A/D and memory) is shown. However, it is recognized that sequential control of the channels is also possible. Additionally, processor 7 enables the memory contents to be analyzed and/or modified if required before read out. This permits the stored signal to be modified in frequency, phase and amplitude.

To illustrate this process, let us assume a signal has already been stored and it is required to phase reverse every tenth sample. With this pre-condition the processor 7 flags the control logic unit 6. The processor will indicate to the control logic unit 6 that the first sample is to be read from the first memory location of the memory unit 3 of channel 1. The control logic will provide the appropriate address and access the required data sample. This sample is then passed to the processor 7 and inverted. The inverted sample is then sent to the control logic unit 6 which outputs the correct address location and read command to store the altered sample in the same accessed memory location. Next the processor 7 flags the control logic unit 6 and requests the eleventh sample. The complete process is repeated until every tenth sample has been inverted. Once all appropriate samples have been altered the processor 7 initiates a write out sequence which permits the stored samples to be converted, sampled and combined in a time-series fashion on the output delay time. Other types of modifications are possible.

In this example it was shown that a pre-condition existed, however the processor may equally read in all the stored samples to analyze them and decided (based on preprogrammed conditions) what modifications are to be implemented.

Figure 3:
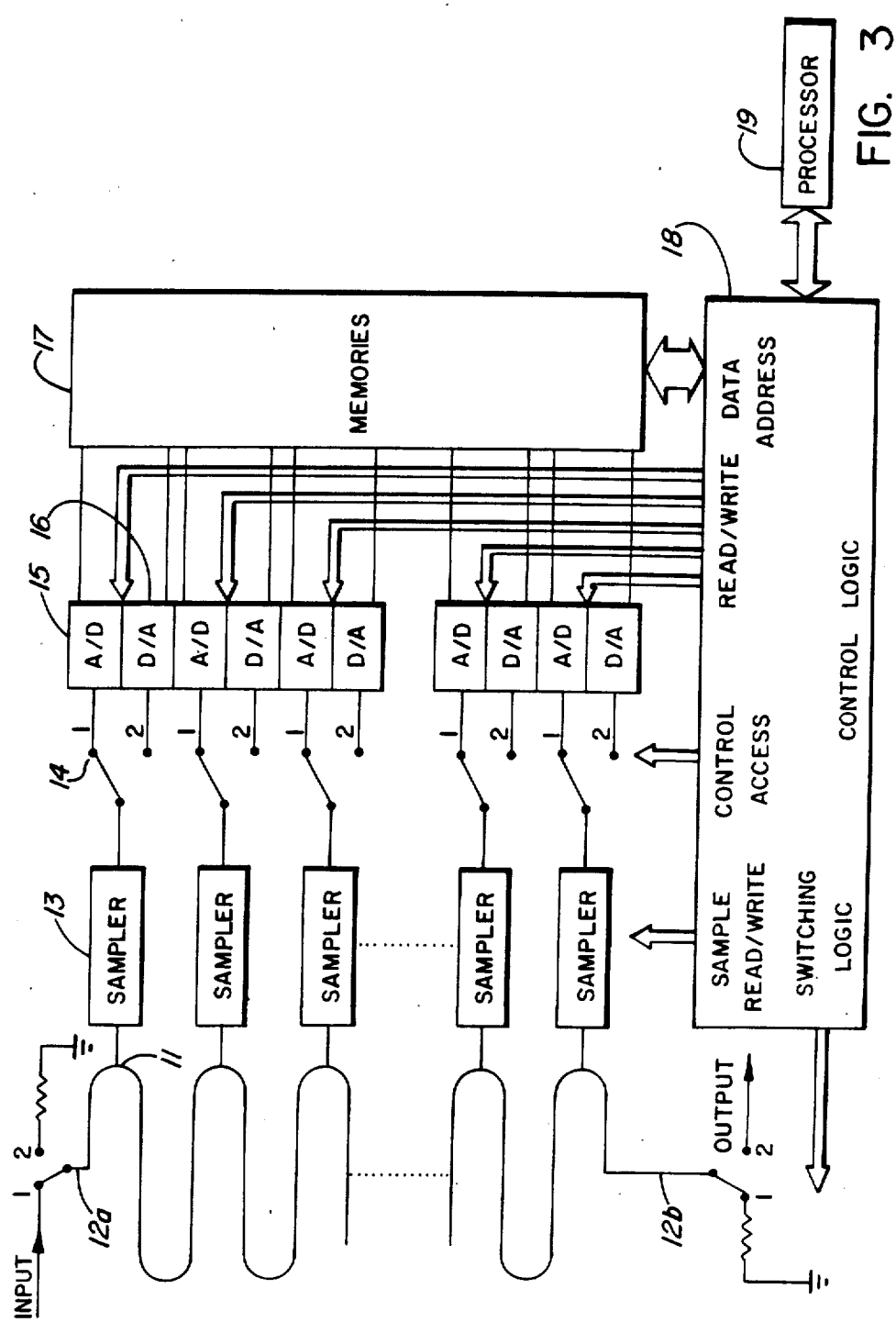
FIG. 3 shows a block diagram of another embodiment used in the present invention.

Another embodiment of the configuration of FIG. 2 can be implemented as is shown in FIG. 3. The circuit of FIG. 3 shows an embodiment which uses a single delay line instead of an input and output delay line. This implementation provides for a decrease in the number of components and therefore a decrease in size. The implementations of FIGS. 1 and 2 allow continuous read and write of the digital memory. However if continuous operation is not required the circuit of FIG. 3 can be used.

It is comprised of an input/output delay line 11, first switching means 12a and 12b, samplers 13, second switching means 14, analog to digital converters 15, digital to analog converters 16, memories 17, control logic 18 and processor 19. With the first and second switching means placed in position 1, an input signal is allowed to be distributed along the delay line 11. Control logic 18 generates a command to the samplers 13 to sample the input waveform and to the A/D converters 15 to convert the sample to a digital word. Memory addresses are generated in memories 17 by the control logic 18 and the digital words corresponding to the samples are stored in memories 17. To reconstruct the output waveform, the first and second switching means are switched to position 2, which therefore allows a stored digital word converted back to an analog level by D/A converters 16 to be transferred to samplers 13 and distributed to the input/output delay 11.

It will be understood by those knowledgeable in this art that the switching means 14 can consist of a simple diode network or a circulator to allow flow of information in only one direction.

Figure 4:
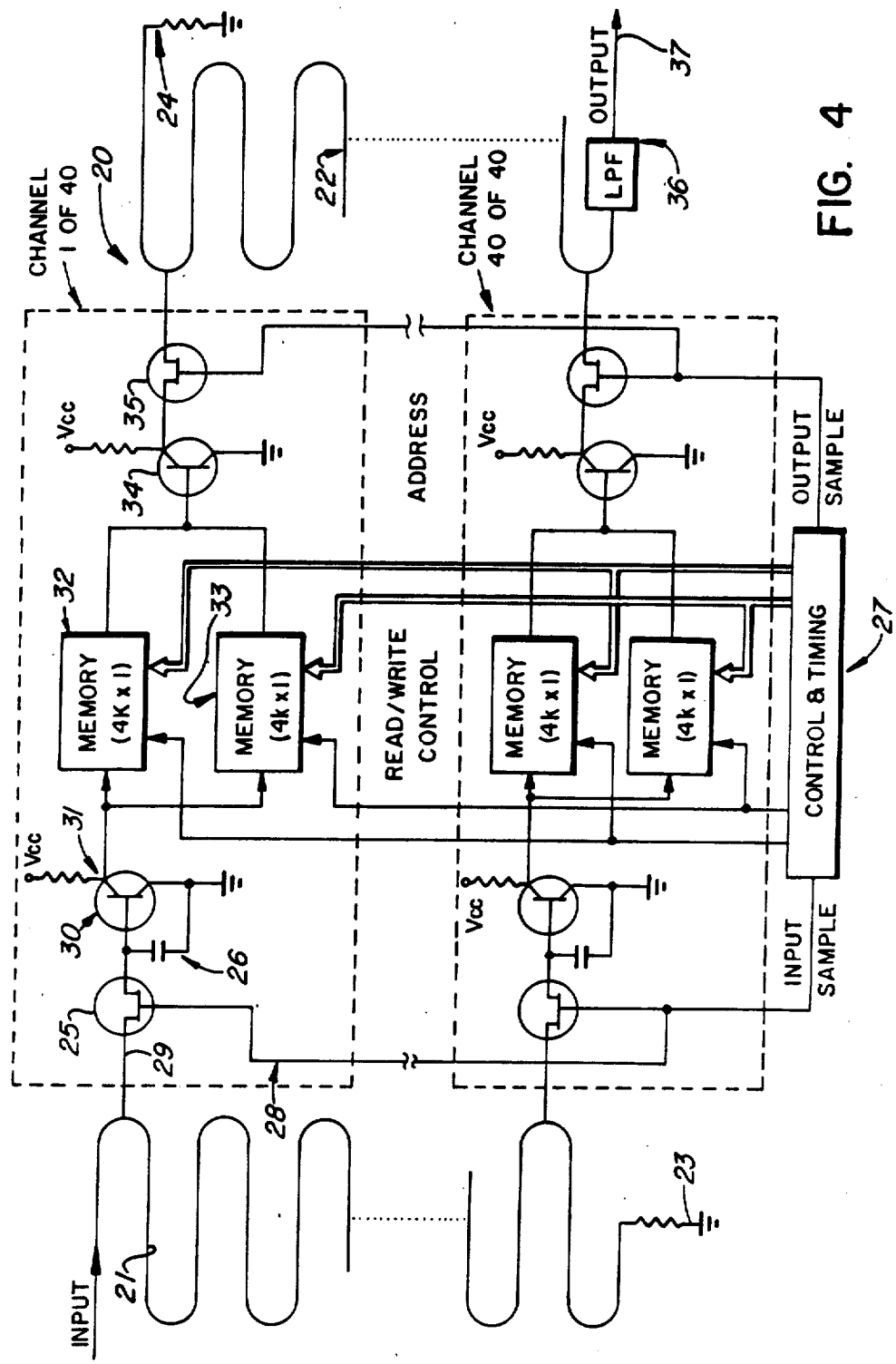
FIG. 4 is a schematic diagram of a particular implementation of interest used for the present invention.

Shown in FIG. 4 is a particular implementation of interest used in the present invention. Reference numeral 20 shows a 0 to 500 MHz, 330 microsecond broadband digital RF memory. In this application, the amplitude information of the input waveform is not required, nor is phase or frequency translations required. The memory devices chosen for this application have a read/write cycle time of 40 nanoseconds corresponding to a rate of 25 MHz. To provide sampling at the Nyquist rate of 1 GHz requires the use of 40 memory channels. Thus the inter-tap spacing along the input delay line 21 and output delay line 22 corresponds to 1 nanosecond. The input delay line 21 and the output delay line 22 are of microstrip configuration with termination resistors 23 and 24 to prevent unwanted reflections at the ends of the lines.

The input waveform is sampled in parallel and temporarily stored at each tap by means of a FET switch 25 and a capacitor 26. The base-emitter capacitance of the transistor is sufficient to store the sampled signal for 40 nanoseconds. The narrow sample pulse (1 nanosecond) generated by the control logic 27 is applied to the gate 28 of the FET 25 causing it to conduct and thereby allowing the capacitor 26 to charge to the level of the input signal present at the tap 29. Since only the polarity of the input waveform (rather than the amplitude) is required, a one bit analog-to-digital converter in the form of a single transistor 30 is used. This transistor is biased to conduct if the polarity of the input is positive and hence approximately 0 volts is read at the collector 31. This value is clocked into the memory 32 as a logical "0". Conversely a logical 1 is stored when the input polarity is negative.

To provide the desired capacity, 8192 bits of memory per channel are required. To provide an almost instantaneous read/write capability, two 4096×1 bit tri-state memories 32 and 33 are used for each channel. These are activated on alternate clock phases such that successive input samples are stored in alternate memories. Thus while one memory is being written to, reading can take place from the other. This process of interleaving memory units can be extended to increase the effective sampling rate per channel and hence reduce the number of channels required. However, the total memory capacity remains the same.

The waveform is reconstructed at the output delay line 22 by the reverse process. A single transistor 34 is used per channel to provide signal inversion so that the output polarity matches that of the input. The output of this transistor is sampled onto the output delay line via a FET 35 similar to that used on the input. The high frequency components resulting from the sampling process are then filtered out at the output of the output delay line by means of a low pass filter 36. Therefore, assuming a pure sinusoidal signal is fed at the input 21, the sinusoidal signal would be converted to digital bits and stored in memory locations 32 and 33. The output transistors 34 and 35 would allow the transfer of these bits to the output delay line 22 such that a square wave type signal is reconstructed. Therefore by the use of a low pass filter, the original sinusoidal can be reproduced at the output 37. If the fidelity of the output signal is to be increased the capability of the A/D converters can be increased, for example 8 bit or 12 bit A/D converters are available and could be used for each channel to transform a sampled analog signal to a digital form which would be stored in the address locations of memories 32 and 33. The signals could then be converted by D/A converters having the same capability and later reconstructed at the output delay line 22.

It will be understood by those knowledgeable in this art that other types of components such as coaxial or surface acoustic wave delay lines and diode samplers could be used to realize various functions of the circuit. Although this disclosure is in terms of microstrip delay lines, A/D converters and digital memories, it is intended to cover other possible means of realizing the same functions. This would include techniques of memory interleaving which would influence the method in which the signal is acquired.

There has been described a novel approach to digitally store very wideband high frequency signals through the use of distributed sampling techniques which permit acquisition, storage and reconstruction or modification of the input signal.

The embodiments of the invention in which an exclusive property or privilege is claimed are defined as follows:

1. An intelligent boardband digital RF memory comprising:
   input/output delay line means for distributing an input signal;
   means coupled to said input/output delay line means for sampling the distributed signal at predetermined points along said delay line means;
   means coupled to said sampling means for A/D converting said samples from analog levels to digital words;
   means coupled to said A/D converting means for storing said digital words;
   control and processor means coupled to said storing means for accessing, modifying and analyzing said stored digital words;
   means coupled to said storing means for D/A converting said digital words to analog levels; and
   means coupled to said D/A converting means for applying said analog levels to said input/output delay line means at points corresponding to said predetermined points, whereby a reconstructed signal is formed.

2. An intelligent broadband digital RF memory as defined in claim 1 wherein said input/output delay line means consist of an input delay line for distributing an input signal to said sampling means and an output delay line for reconstructing an output signal.

3. An intelligent broadband digital RF memory as defined in claim 1 wherein said input/output delay line means consists of a single delay line allowing an input signal to be distributed and an output signal to be reconstructed.

4. An intelligent broadband digital RF memory as defined in claims 1 or 3 further comprising:
   switching means coupled to said input/output delay line means to allow said distributed input signal to be transferred to said A/D converting means and to allow said analog levels to be transferred from said D/A converting means to said applying means.

5. An intelligent broadband digital RF memory as defined in claim 1, in which said control and process means causes said applying means to repetitively apply the analog levels to said corresponding points.

6. An intelligent broadband digital RF memory as defined in claims 1 or 2, wherein said control and process means causes said sampling means to repetitively sample the amplitude of the distributed signal.

7. An intelligent broadband digital RF memory as defined in claim 1, wherein said storing means consist of a plurality of digital memory means, each having a plurality of storage locations for storing a digital word corresponding to an analog level sampled from said distributed signal.

8. An intelligent broadband digital RF memory as defined in claims 1 or 3, wherein said applying means consist of samplers controlled by said control and processor means.

9. An intelligent broadband digital RF memory comprising:
   an input delay line for distributing an input signal;
   means coupled to said input delay line for sampling the amplitude of a distributed input signal at first predetermined points along the input delay line;
   means coupled to said sampling means for A/D convering said samples from analog levels to digital words;
   a plurality of digital memory means coupled to said A/D converting means, each having a plurality of storage locations for storing a digital word corresponding to an analog level sampled from said distributed signal;
   processor and control logic means coupled to said memory means for accessing, modifying and analyzing data in said storage locations of said digital memory means;
means coupled to said memory means for D/A converting said digital words to analog levels;
output delay line means; and
means coupled to said D/A converting means for applying said analog levels to the output delay line means at points corresponding to said predetermined points, whereby a reconstructed signal is formed.

* * * * *